US012775038B2

(12) United States Patent
Forasacco et al.

(10) Patent No.: US 12,775,038 B2
(45) Date of Patent: Oct. 27, 2026

(54) ENHANCED INTERFACE FOR CHECKING AND NEUTRALIZING AN ELECTRICAL POWER SUPPLY LINE OF AN AIRCRAFT AND AIRCRAFT COMPRISING SUCH AN INTERFACE

(71) Applicant: Airbus Operations SAS, Toulouse (FR)

(72) Inventors: Sébastien Forasacco, Toulouse (FR); Yvan Fernandez Ramos, Toulouse (FR); Loïc Aranda, Toulouse (FR); Alexis Hebert, Toulouse (FR); Jérôme Faucher, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 196 days.

(21) Appl. No.: 18/676,035

(22) Filed: May 28, 2024

(65) Prior Publication Data

US 2024/0402232 A1 Dec. 5, 2024

(30) Foreign Application Priority Data

May 30, 2023 (FR) ....................................... 2305338

(51) Int. Cl.

*G01R 31/00* (2006.01)
*B64F 5/60* (2017.01)
*G01R 1/04* (2006.01)

(52) U.S. Cl.

CPC .............. *G01R 31/008* (2013.01); *B64F 5/60* (2017.01); *G01R 1/0416* (2013.01); *B64D 2221/00* (2013.01)

(58) Field of Classification Search

CPC ....... G01R 31/008; G01R 1/0416; B64F 5/60; B64D 2221/00

USPC .......................................................... 324/503

See application file for complete search history.

(56) References Cited

U.S. PATENT DOCUMENTS 3,234,338 A * 2/1966 Foster ...................... G11B 5/10 360/123.01
3,249,928 A * 5/1966 Curtis ...................... G11B 5/29 360/129
3,299,218 A * 1/1967 Wagenhals ............... G11B 5/10 360/123.01
3,602,912 A * 8/1971 Bowers ..................... H01F 5/00 360/123.01

(Continued)

FOREIGN PATENT DOCUMENTS

DE 102020212917 A1 * 4/2022 ............. G01R 31/55
FR 2987882 A1 * 9/2013 ............ F16L 25/026
FR 3067875 A1 * 12/2018 ................ H02J 4/25

OTHER PUBLICATIONS

French Search Report for corresponding French Patent Application No. 2305338 dated Nov. 16, 2023.

*Primary Examiner* — Christopher P Mcandrew
(74) *Attorney, Agent, or Firm* — Greer, Burns & Crain, Ltd.

(57) ABSTRACT

An enhanced interface for checking an aircraft electrical power supply line, the interface being configured to easily and rapidly check an absence of electrical potential at at least one determined point of an aircraft electrical installation comprising an equipment item of high-voltage type. Also to an aircraft comprising such an enhanced interface and a method for checking and neutralizing an electrical power supply line of an aircraft.

10 Claims, 2 Drawing Sheets

(56) References Cited

U.S. PATENT DOCUMENTS

| | | | | |
|---|---|---|---|---|
| 4,904,932 | A * | 2/1990 | Schweitzer, Jr. | H02G 15/107 324/156 |
| 5,376,789 | A * | 12/1994 | Stenhagen | G01N 30/7266 250/281 |
| 6,972,554 | B1 * | 12/2005 | Davis | G01R 31/343 324/121 R |
| 7,217,012 | B2 * | 5/2007 | Southard | G09F 13/22 362/240 |
| 8,257,106 | B2 * | 9/2012 | Fornage | H01R 43/26 439/304 |
| 10,017,135 | B2 * | 7/2018 | Tsukamoto | B60R 16/03 |
| 10,553,993 | B2 * | 2/2020 | Allen | H02G 3/045 |
| 2011/0183537 | A1 * | 7/2011 | Fornage | H01R 13/639 439/271 |
| 2012/0025604 | A1 * | 2/2012 | Baumann | H02J 3/36 307/9.1 |
| 2016/0122037 | A1 | 5/2016 | Forget | |
| 2016/0240979 | A1 | 8/2016 | Joo et al. | |
| 2018/0287482 | A1 * | 10/2018 | Schult | B60R 16/03 |
| 2019/0319408 | A1 * | 10/2019 | Allen | H01R 31/06 |

* cited by examiner

ENHANCED INTERFACE FOR CHECKING AND NEUTRALIZING AN ELECTRICAL POWER SUPPLY LINE OF AN AIRCRAFT AND AIRCRAFT COMPRISING SUCH AN INTERFACE

CROSS-REFERENCES TO RELATED APPLICATIONS

This application claims the benefit of French Patent Application Number 2305338 filed on May 30, 2023, the entire disclosure of which is incorporated herein by way of reference.

FIELD OF THE INVENTION

The present invention relates to an interface for checking and neutralizing an electrical power supply line intended to supply power to at least one equipment item on board an aircraft. The invention relates more particularly to an interface that makes it possible to check for an absence or a presence of electrical potential at one or more points of an electrical power supply line and to neutralize, if necessary, the electrical power supply line by connection to a reference equipotential.

BACKGROUND OF THE INVENTION

An inspection or maintenance intervention on an electrical energy supply line entails observing safety procedures that aim to verify the electrical status of the power supply line and to neutralize the electrical power supply line to be able to intervene thereon without the risk of electrification.

Checking tools of voltmeter or multimeter type, discharge rods and earth connection clamp conductors are conventionally used to perform such checking and neutralization operations prior to an intervention on an electrical distribution line or else in an electrical distribution board. The environment of an aircraft appears to be specific with respect to the distribution of electrical energy since the many equipment items are joined in small, even cramped, spaces. The density of electrical energy of some of the circuits on board an aircraft is such that the usual checking and neutralization means are not very well suited to the specific environment inside an aircraft, notably in the technical spaces. There is therefore a need to optimize the means for checking and neutralizing electrical power supply lines on board an aircraft and the situation can be improved.

SUMMARY OF THE INVENTION

One object of the present invention is to offer simple and rapid possibilities for checking an electrical power supply line on board an aircraft. To this end, a checking interface for an electrical power supply line of an aircraft is proposed, the electrical power supply line being configured to supply power to an electrical equipment item of the aircraft, the checking interface comprising an electrical insulation housing passed through by at least one electrically conductive element of the electrical power supply line, connected to the equipment item and provided with an electrically insulating sheath outside of the equipment item and of the electrical insulation housing and having a surface without any electrical insulation inside the electrical insulation housing, the checking interface being arranged such that:

- a gauged opening is arranged in the electrical insulation housing facing the surface without any electrical insulation of each of the electrically conductive elements,
- each of the electrically conductive elements is linked electrically to a connection stud arranged on an outer surface of the electrical insulation housing, and,
- a removable neutralization conductor, connected to a reference equipotential and having a terminal connector configured for a connection to a connection stud of the electrical insulation housing is available for a connection to said stud.

The checking interface for an electrical power supply line according to the invention can also have the following features, considered alone or in combination:

Two electrically conductive elements pass through the electrically insulating housing, which housing comprises two gauged openings respectively arranged facing two surfaces without any electrical insulation each arranged on one of the two electrically conductive elements, two connection studs respectively linked to the two electrically conductive elements and the interface comprises two removable neutralization conductors linked to a reference equipotential and each comprising a terminal connector each configured to make an electrical connection to one of said studs.

A gauged opening of the electrical insulation housing is a bore with a diameter less than or equal to 12.5 mm and the central longitudinal axis of which passes through the surface without any electrical insulation of the electrical element, facing which surface said gauged opening is arranged in the electrical insulation housing.

Any connection stud of the electrical insulation housing and any neutralization conductor is electrically insulated to prevent any touch contact with an element linked electrically to an electrically conductive element.

The checking interface is arranged on a face of an electrical equipment item of an aircraft.

Also a subject of the invention is an electrical system of an aircraft comprising an electrical equipment item and a checking interface as previously described.

According to one embodiment, the aircraft electrical system as described above further comprises at least one measurement or discharge probe arranged to be inserted into a gauged opening of the interface and to establish an electrical contact with the surface without any electrical insulation disposed facing the opening.

Also a subject of the invention is an aircraft comprising at least one checking interface as previously described or one system as cited previously.

Finally, a subject of the invention is a method for checking and neutralizing an electrical power supply line of an aircraft, the method being executed via a checking interface as cited previously and the method comprises:

- a measurement of electrical potential of at least one electrically conductive element, with respect to the reference equipotential, by insertion of a measurement probe into the gauged opening arranged facing said surface without any electrical insulation of said electrically conductive element,
- a discharge of electrical potential of at least one electrically conductive element by insertion of a discharge probe into the gauged opening arranged facing said surface without any electrical insulation of said electrically conductive element, and,
- a neutralization of at least one electrically conductive element of the electrical power supply line by connection of a terminal connector of a removable neutralization conductor to the connection stud of the checking interface linked to this electrically conductive element of the power supply line.

BRIEF DESCRIPTION OF THE DRAWINGS

The features of the invention mentioned above, and others, will emerge more clearly on reading the following description of an exemplary embodiment, said description being given in relation to the attached drawings.

DETAILED DESCRIPTION OF THE PREFERRED EMBODIMENTS

Figure 1:
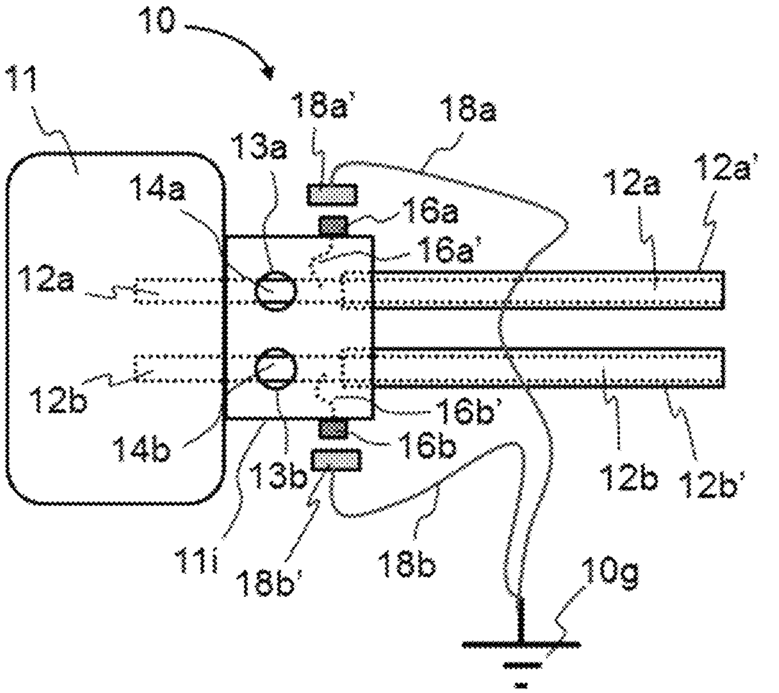
FIG. 1 schematically and symbolically illustrates an electrical power supply checking interface according to one embodiment.

FIG. 1 schematically and symbolically represents a checking and neutralization interface 10 for a power supply line of an electrical equipment item 11 arranged on board an aircraft. The checking and neutralization interface 10 is called checking interface hereinafter in the present description. The expression "checking interface for a power supply line" here denotes a set of means made available to an operator to determine the electrical status of an electrical power supply line of an equipment item and to neutralize this electrical power supply line, if necessary, so as to ensure the safety of the operator. According to the exemplary embodiment illustrated in FIG. 1, the electrical power supply line of the electrical equipment item 11 comprises a first electrically conductive element 12*a* and a second electrically conductive element 12*b*. The two electrically conductive elements 12*a* and 12*b* pass through an electrical insulation housing 11*i* produced in an electrically insulating material. The insulation housing 11*i* has a closed volume, or more specifically a quasi-closed volume inasmuch as one or more openings are shrewdly arranged therein, which openings are described hereinbelow. The insulation housing 11*i* is preferentially arranged against the electrical equipment item 11 and in physical contact therewith. The electrically conductive elements 12*a* and 12*b* are respectively surrounded by insulating sheaths 12*a*' and 12*b*' at least for their parts (or portions) which are both external to the insulation housing 11*i* and external to the electrically powered electrical equipment item 11, and outside of any other electrically insulated equipment item. The terminal parts of the electrically conductive elements 12*a* and 12*b* are linked on the one hand to electrical circuits internal to the electrical equipment item 11 and on the other hand to a source of electrical energy, or else to an intermediate power element disposed between a source of electrical energy and the electrical insulation housing 11*i* (for example a power switch). These elements are not illustrated here in detail inasmuch as they are not useful to the understanding of the invention. Shrewdly, gauged openings 13*a* and 13*b* are arranged in the insulation housing 11', respectively positioned facing the electrically conductive elements 12*a* and 12*b*, to respectively face surfaces 14*a* and 14*b* of the electrically conductive elements 12*a* and 12*b* that are without any electrical insulation and are internal to the insulation housing 11*i*.

The expression "gauged openings" here denotes openings whose form and dimensions imply an orientation of measurement probes configured to enter into mechanical and electrical contact with the electrically conductive elements 12*a* and 12*b* and provided to take an electrical measurement of the electrical status of the conductive elements 12*a* and 12*b*. Thus, for example, the gauged openings 13*a* and 13*b* are bores with a diameter that does not exceed 12.5 mm so as to each allow a probe of generally cylindrical form to pass and to prevent any touch contact of an operator with one of the electrically conductive elements 12*a* and 12*b*. A measurement via the insertion of probes into the gauged openings 13*a* and 13*b* makes it possible to avoid any contact of the operator with an element having a dangerous electrical potential with a view to performing an on-board checking or maintenance operation, in relation to the electrical power supply line of the equipment item 11. According to one embodiment, seal-tight plugs are arranged in the gauged openings 13*a* and 13*b* outside of any measurement or checking operation. According to one embodiment, these plugs (not represented in FIG. 1) are attached to the electrical insulation housing 11*i*, so as to avoid the loss thereof. More advantageously, the electrically conductive elements 12*a* and 12*b* are respectively electrically linked to external connection studs 16*a* and 16*b* each arranged on a face of the insulation housing 11*i*. The external connection studs 16*a* and 16*b* are also here called connection studs 16*a* and 16*b*. The connection between an electrically conductive element and a connection stud is made via electrical connections internal to the insulation housing 11*i* implemented by cables or conductive elements of "busbar" type, by way of examples. The connection studs 16*a* and 16*b* advantageously make it possible to neutralize the electrical potential of each of the electrically conductive elements 12*a* and 12*b* by making an electrical link (connection) between each of the studs and a reference equipotential. For example, the electrical power supply line primarily composed of the electrically conductive elements 12*a* and 12*b* can be neutralized by connecting the connection studs 16*a* and 16*b* to a reference ground of an electrical system of the aircraft. Shrewdly, the checking interface 10 comprises two removable neutralization conductors 18*a* and 18*b* linked to a reference equipotential 10*g*. According to the example illustrated, the equipotential 10*g* is a reference ground of the aircraft that allows the neutralization of the electrically conductive elements 12*a* and 12*b* to a zero electrical potential. According to one embodiment, each of the removable neutralization conductors 18*a* and 18*b* is terminated by a terminal connector. Thus, the removable neutralization conductor 18*a* is terminated by a terminal connector 18*a*' configured to make an electrical connection with the connection stud 16*a* or else with the connection stud 16*b* and the removable neutralization conductor 18*b* is terminated by a terminal connector 18*b*' configured to make an electrical connection with the connection stud 16*a* or else with the connection stud 16*b*. A "removable" nature of a neutralization conductor here describes the fact that the terminal connector of this neutralization conductor can be connected and disconnected at will to or from the connection stud which is complementary to it on the checking interface, depending on whether or not the electrically conductive element linked to the connection stud has to be neutralized. According to one embodiment, a single conductor comprises two connection terminal elements to make a simultaneous connection of the electrically conductive elements 12*a* and 12*b* to the reference equipotential 10*g*, via the connection studs 16*a* and 16*b*. The removable neutralization conductors

18*a* and 18*b* are preferentially electrically insulated to prevent a direct contact with an operator. According to one embodiment, the terminal connectors 18*a*' and 18*b*' are also provided with an insulating cladding (a sheath for example) to prevent any touch contact with an element whose electrical potential may present a danger. According to one embodiment, the connection studs 16*a* and 16*b* are configured to each receive a cap, a plug or an electrically insulating cover in the absence of connection of a removable conductive element aiming to electrically neutralize the electrically conductive element which is electrically linked thereto.

The arrangement of the checking interface 10 advantageously makes it possible to perform checking and neutralization operations in a reduced space, simply and rapidly, prior to any subsequent checking and/or maintenance intervention on the electrical power supply line and/or the electrical equipment item 11.

Figure 2:
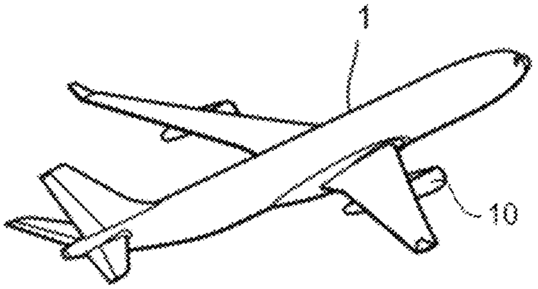
FIG. 2 schematically illustrates an aircraft comprising a checking interface as illustrated in FIG. 1 or an electrical system comprising such an interface; and, FIG. 3 is a diagram illustrating a method for checking and neutralizing an electrical power supply line according to an embodiment.

FIG. 2 illustrates an aircraft 1 comprising at least one checking interface for an electrical power supply line such as the checking interface 10.

The invention is not limited to just the embodiments described hereinabove and can relate to variants. For example, the checking interface 10 can comprise three or four electrically conductive elements, or more. Furthermore, the insulation housing 11*i* can be a subassembly of the electrical equipment item 11. According to other variants, the gauged openings 13*a* and 13*b* can have varied forms and orientations defined to facilitate measurement operations in a cramped environment.

Figure 3:
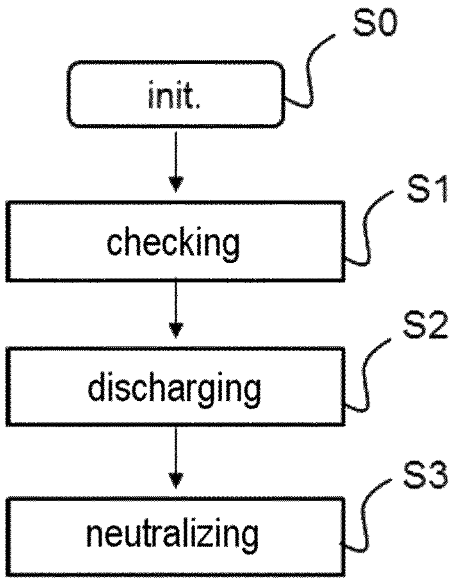

FIG. 3 is a diagram illustrating steps of a method for checking and neutralizing an electrical line on board an aircraft by means of a checking and neutralization interface similar to the checking and neutralization interface 10. According to the exemplary method described hereinbelow, the interface used for the execution of the method is the checking and neutralization interface 10. A step S0 is an initial step at the end of which a maintenance operator (or aircraft systems installer) is normally equipped and ready to carry out checking and neutralization operations on an aircraft electrical power supply line via the checking and neutralization interface 10. In a step S1, the operator uses a measurement probe of gauged form complementing the form of the gauged opening 13*a* and inserts it into the gauged opening 13*a* until the end of the measurement probe makes it possible to establish an electrical contact with a part 14*a* without any electrical insulation of the electrically conductive element 12*a*. The probe is further linked to a measurement device or equipment item, which measurement device is further linked to the reference equipotential 10*g*, so as to make it possible to take a measurement of the electrical potential of the electrically conductive element 12*a*, and to verify, if necessary, that this electrical potential is harmless in terms of protecting people. In a step S2, the operator inserts a discharge probe into the gauged opening 13*a*, after having removed the measurement probe previously used for the measurement. The discharge probe too has a form complementing the form of the gauged opening, so as to be correctly oriented to establish an electrical contact with a part 14*a* without any electrical insulation of the electrically conductive element 12*a*. The discharge probe is on the other hand linked to the reference equipotential 10*g* so as to discharge any electrical charges via this equipotential, if necessary. Finally, in a step S3, the operator removes the plug or cap protecting the connection stud 16*a* and connects to the connection stud 16*a* the terminal element 18' of the removable neutralization conductor 18*a* (or else the terminal element 18*b*' of the neutralization conductor 18*b*) which is moreover linked to the reference equipotential 10*g*, which by definition and by design has a neutral potential. Thus, it is advantageously possible to check and neutralize easily, and in a reduced space on board an aircraft, the conductive element 12*a*. The method is exactly similar for carrying out a check and a neutralization of the electrically conductive element 12*b*, but by using the gauged opening 13*b* and the connection stud 16*b*. It should be noted that it is possible to discharge any residual electrical charges, in the step S2 by directly linking the conductive elements 12*a* and 12*b* by means of two discharge probes respectively inserted into the gauged openings 13*a* and 13*b* and linked to one another, and preferentially, in addition, linked to the reference equipotential 10*g*.

According to one embodiment, one or more measurement and discharge probes are included in a checking and neutralization system comprising the checking and neutralization interface 10. According to one embodiment, the checking and neutralization interface is configured to satisfy the protection conditions as defined in association with the protection index IP2X, that is to say by having a level 2 of protection with respect to solid elements.

According to one embodiment, such a checking and neutralization system comprising one or more measurement and discharge probes further comprises an electrical potential measurement device configured to measure an electrical potential higher than the maximum electrical potential for which the electrical power supply line is provided.

The systems and devices described herein may include a controller or a computing device comprising a processing and a memory which has stored therein computer-executable instructions for implementing the processes described herein. The processing unit may comprise any suitable devices configured to cause a series of steps to be performed so as to implement the method such that instructions, when executed by the computing device or other programmable apparatus, may cause the functions/acts/steps specified in the methods described herein to be executed. The processing unit may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory may be any suitable known or other machine-readable storage medium. The memory may comprise non-transitory computer readable storage medium such as, for example, but not limited to, an electronic, magnetic, optical, electromagnetic, infrared, or semiconductor system, apparatus, or device, or any suitable combination of the foregoing. The memory may include a suitable combination of any type of computer memory that is located either internally or externally to the device such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. The memory may comprise any storage means (e.g., devices) suitable for retrievably storing the computer-executable instructions executable by processing unit.

The methods and systems described herein may be implemented in a high-level procedural or object-oriented programming or scripting language, or a combination thereof, to communicate with or assist in the operation of the controller or computing device. Alternatively, the methods and systems described herein may be implemented in assembly or machine language. The language may be a compiled or interpreted language. Program code for implementing the methods and systems described herein may be stored on the storage media or the device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein.

Computer-executable instructions may be in many forms, including modules, executed by one or more computers or other devices. Generally, modules include routines, programs, objects, components, data structures, etc., that perform particular tasks or implement particular abstract data types. Typically, the functionality of the modules may be combined or distributed as desired in various embodiments.

It will be appreciated that the systems and devices and components thereof may utilize communication through any of various network protocols such as TCP/IP, Ethernet, FTP, HTTP and the like, and/or through various wireless communication technologies such as GSM, CDMA, Wi-Fi, and WiMAX, is and the various computing devices described herein may be configured to communicate using any of these network protocols or technologies.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A checking interface for an electrical power supply line of an aircraft, the electrical power supply line configured to supply power to an electrical equipment item of said aircraft, said checking interface comprising:

an electrical insulation housing passed through by at least one electrically conductive element of the electrical power supply line connected to said equipment item and provided with an electrically insulating sheath outside of said equipment item and of said electrical insulation housing and having a surface without any electrical insulation inside said electrical insulation housing, a gauged opening arranged in said electrical insulation housing facing said surface without any electrical insulation for each of the at least one electrically conductive elements, wherein the gauged opening is dimensioned and configured to selectively receive an external measurement probe or an external discharge probe independently of the electrically conductive element such that the gauged opening is closed by a removable electrically insulating plug or cap when no external measurement probe or external discharge probe is inserted into the gauged opening, each of the at least one electrically conductive elements linked to a connection stud arranged on an outer surface of said electrical insulation housing, and, a removable neutralization conductor connected to a reference equipotential and having a terminal connector configured for a connection to a connection stud of said electrical insulation housing for selective connection to said stud.

2. The checking interface according to claim 1, wherein two electrically conductive elements pass through said electrically insulating housing, said electrically insulating housing comprising two gauged openings respectively arranged facing two surfaces without any electrical insulation each arranged on one of said two electrically conductive elements, two connection studs respectively linked to the two electrically conductive elements and two removable neutralization conductors linked to a reference equipotential and each comprising a terminal connector each configured for a connection to one of said studs.

3. The checking interface according to claim 1, wherein the gauged opening is a bore having a diameter less than or equal to 12.5 mm, the bore having a central longitudinal axis that passes through said surface without any electrical insulation of the at least one electrically conductive element, the bore being arranged in said electrical insulation housing facing said surface.

4. The checking interface according to claim 1, wherein any connection stud and any neutralization conductor is electrically insulated to prevent any touch contact with an element linked electrically to an electrically conductive element.

5. The checking interface according to claim 1, arranged on a face of an electrical equipment item of an aircraft.

6. An electrical system of an aircraft comprising:

an electrical equipment item and the checking interface according to claim 1.

7. The electrical system according to claim 6, further comprising:

at least one measurement or discharge probe configured to be inserted into a gauged opening of said interface and to establish an electrical contact with said surface without any electrical insulation disposed facing said opening.

8. An aircraft comprising:

the electrical system according to claim 6.

9. A method for checking and neutralizing an electrical power supply line of an aircraft, the method being executed via the checking interface according to claim 1, the method comprises:

carrying out a measurement of electrical potential of the at least one electrically conductive element, with respect to the reference equipotential, by insertion of a measurement probe into the gauged opening arranged facing said surface without any electrical insulation of said at least one electrically conductive element, carrying out a discharge of electrical potential of at least said electrically conductive element by insertion of a discharge probe into the gauged opening arranged facing said surface without any electrical insulation of said at least one electrically conductive element, and, carrying out a neutralization of at least said electrically conductive element of the electrical power supply line by connecting a terminal connector of a removable neutralization conductor to the connection stud of the checking interface linked to said at least one electrically conductive element of the power supply line.

10. The checking interface according to claim 1, wherein the connection stud includes an electrically insulating protective cover configured to prevent touch contact when the removable neutralization conductor is not connected.

* * * * *